United States Patent [19]

Otsuka et al.

[11] 4,365,347
[45] Dec. 21, 1982

[54] CHANNEL SELECTING SYSTEM FOR USE IN A MULTI-CHANNEL MOBILE COMMUNICATION SYSTEM

[75] Inventors: Shigeru Otsuka; Tomokazu Kai, both of Tokyo, Japan

[73] Assignee: Nippon Electric Co., Ltd., Tokyo, Japan

[21] Appl. No.: 228,544

[22] Filed: Jan. 26, 1981

[30] Foreign Application Priority Data

Jan. 31, 1980 [JP] Japan .................. 55-10752

[51] Int. Cl.$^3$ .................. H04B 1/16; H04B 15/00
[52] U.S. Cl. .................. 455/179; 455/33; 455/62; 455/52
[58] Field of Search .................. 455/31–33, 455/62, 179, 52, 226, 54; 179/2 EB; 375/40, 100

[56] References Cited

U.S. PATENT DOCUMENTS

| | | | |
|---|---|---|---|
| 3,913,017 | 10/1975 | Imaseki .................. | 455/33 |
| 3,978,408 | 8/1976 | Gupta et al. .................. | 375/40 |
| 4,034,340 | 7/1977 | Sant'Agostino .................. | 455/226 |
| 4,069,455 | 1/1978 | Sherman, Jr. .................. | 455/226 |
| 4,197,500 | 4/1980 | Klein et al. .................. | 455/62 |

OTHER PUBLICATIONS

"800 MHz Band Land Mobile Telephone Control System" by N. Yohsikawa et al., Review of the Electrical Communication Laboratories, vol. 25, Nos. 11–12, Nov.–Dec. 1977, pp. 1172–1190.

Primary Examiner—Jin F. Ng
Attorney, Agent, or Firm—Blakely, Sokoloff, Taylor & Zafman

[57] ABSTRACT

A channel selecting system for use in a multi-channel mobile communication system. The received field strength associated with each channel is measured sequentially to select a channel in the highest field strength. Within a measurement time span for each channel, time segments in which the field strength is lower than a predetermined level is totalized. When the total reaches either a reference time length which is less than the measurement time span or expiration of the measurement time span, one channel measurement is switched to another.

5 Claims, 10 Drawing Figures

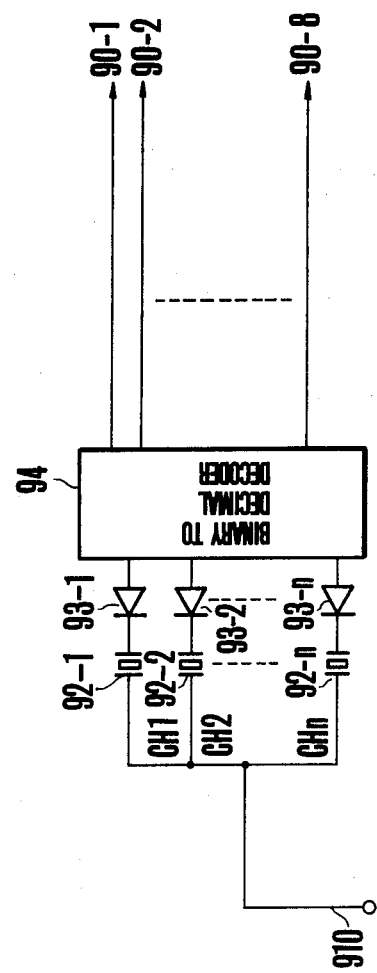

CHANNEL SELECTING SYSTEM FOR USE IN A MULTI-CHANNEL MOBILE COMMUNICATION SYSTEM

BACKGROUND OF THE INVENTION

The present invention relates to a channel selecting system for use in a multi-channel mobile communication system.

In the mobile communication system in which multi-channel mobile stations travel in service areas where fading occurs due to the multi-path of radio waves, it is necessary for each mobile station to select an allotted channel of the highest field strength at each spot of communication.

There has hitherto been used a channel selecting system, as will be described in detail later, wherein a channel is selected which provides the largest total of time segments in which the input signal exceeds a predetermined level within a predetermined measurement time span. It takes about 0.5 seconds for measuring the relative signal level for one channel, and if one mobile station can use 120 channels, for example, a total of about 60 seconds is required for measuring all channels, disadvantageously resulting in a low efficiency of channel utilization.

SUMMARY OF THE INVENTION

Accordingly, an object of the present invention is to provide a channel selecting system for a multi-channel mobile communication system, which can minimize time required for selecting the best channel.

In order to accomplish the above object of this invention, when the total of time segments in which the field strength is lower than the predetermined level reaches a predetermined reference time length at a time before the predetermined maximum measurement time span has elapsed, the measurement of the field strength received in one channel is stopped at that time and the channel is switched so that the measurement proceeds to the next channel, otherwise the channel is switched when the maximum measurement time span has elapsed.

According to general aspect of the present invention, there is provided a channel selecting system for use in a multi-channel mobile communication system comprising receiver means for receiving radio wave signals on a plurality of channels, and field strength measuring means for sequentially measuring the received field strength associated with each channel, whereby a channel in the highest field strength is selected, said field strength measuring means comprising:

means for totaling time segments in which the field strength is lower than a predetermined level determined by the selecting system, within a measurement time span for each channel;

means for setting a reference time length which is less than the measurement time span; and means for switching one channel measurement to another when the total of time segments reaches at least one of said reference time length and said measurement time span.

BRIEF DESCRIPTION OF THE DRAWINGS

FIG. 9 is a circuit diagram of a local oscillator used in the FIG. 6 circuit arrangement.

DETAILED DESCRIPTION OF PREFERRED EMBODIMENTS

Figure 1:
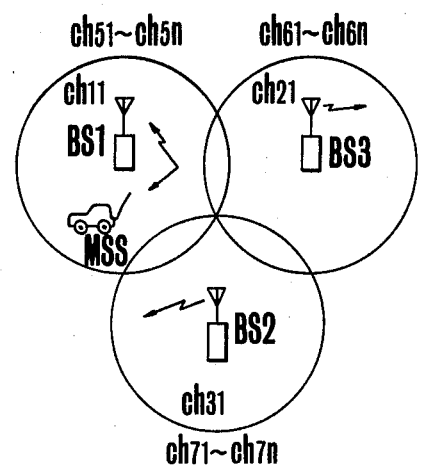
FIG. 1 is a diagrammatic representation showing the interrelation between a multiplicity of service areas for a multi-channel mobile communication system.

Referring now to FIG. 1, an example of a multi-channel mobile communication system to which this invention is applied and the operation of a mobile equipment in part especially of a receiver of the mobile equipment will be described. In a multi-channel mobile communication system of a plurality of cells (having three cells in this example as shown in FIG. 1), a mobile equipment MSS is linked to base stations BS1 to BS3 through radio channels so as to establish the communication. In order to use a limited number of channels efficiently, the common control channel system is often employed for the radio channels. In accordance with the common control channel system, where several of tens or more channels are allocated in a service area in which several of hundreds or more mobile equipments are operated, common control channels which are exclusively dedicated to line connection commonly for all mobile equipments are provided so as to assign the best speech channel for communication. For more information, one may refer to "800 MHz Band Land Mobile Telephone Control System" by N. Yoshikawa et al, Review of the Electrical Communication Laboratories, Vol. 25, Nos. 11 to 12, November–December, 1977. In assigning a speech channel, a number of speech channels are searched automatically for an idle channel, thus connection can be made promptly and speech channels can be used efficiently.

In general common control channel system, there are provided one to several of tens of common control channels (in this example, ch11, ch21 and ch31 using different frequencies, though a common frequency may be used in other cases) and remaining several of tens or more channels as speech channels (in this example, ch51 to ch5n, ch61 to ch6n and ch71 to ch7n).

Accordingly, while a mobile equipment is in the wait mode, it is locked onto one of common control channels ch11, ch21 and ch31, and waits for call origination by the mobile subscriber such as a driver of a vehicle or call termination by another mobile subscriber or land subscriber. As shown in FIG. 1 for example, common control channels ch11, ch21 and ch31 are assigned to base stations BS1, BS2 and BS3, respectively, and a mobile equipment, when its power is switched on, scans and measures the received field strength of ch11, ch21 and ch31 to determine the channel in the highest field strength. In this example, the mobile equipment MSS is currently located within the service area of BS1, and it will receive the strongest signal on ch11,. Then, MSS is locked onto ch11, and waits for call origination by the mobile subscriber or call termination by the base station. Scanning of the common control channels is also carried out when the mobile equipment goes out of one service area and enters a service area of another base station so as to find a common control channel providing the highest signal level in the same way as in the case when power is initially switched on.

If a search for the best common control channel takes a long time, the mobile subscriber must wait for the originating and terminating standby condition for a long time after power of the mobile equipment has been switched on. Moreover, the mobile subscriber can miss an incoming call, while the mobile equipment scans the common control channels in making a transition from one service zone to another. Therefore, it is desirable to minimize the channel scanning time. It is also required to make the channel scanning time as short as possible in selecting a control channel for sending the originating signal to the base station.

Figure 2:
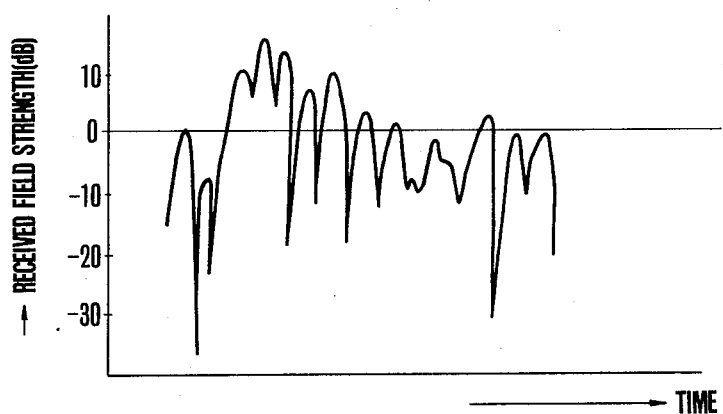
FIG. 2 is a graphic representation showing a varying field strength of electromagnetic wave due to multi-path fading.

In each service area of base stations BS1, BS2 and BS3 of FIG. 1, the reflection of a radio wave from buildings and ground results in creation of the multipath so that there exists a standing wave. The period of fading is proportional to the frequency of the radio wave, and the field strength decreases sharply once per half-wave period at minimum. When the mobile equipment travels in the service area under such environment, it receives varying field strength as shown in FIG. 2, where abscissa represents time and ordinate the field strength received by the mobile equipment with a predetermined input level set to 0 (zero) dB. The field strength of a radio wave received by a mobile equipment varies so widely that it cannot be determined whether or not the signal level is high enough for line connection only by checking an instantaneous signal level which is above the predetermined input level.

Figure 3A:
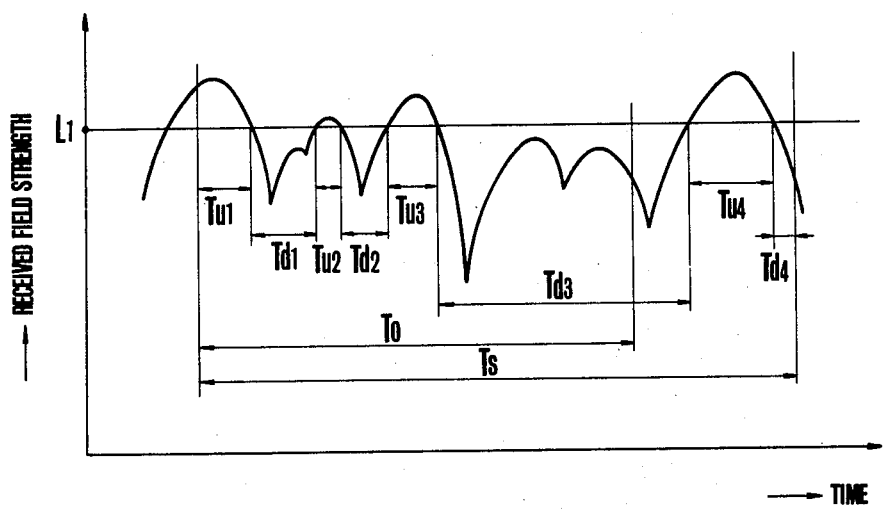
FIGS. 3A and 3B are diagrams showing typical examples of varying input waveforms.
Figure 3B:
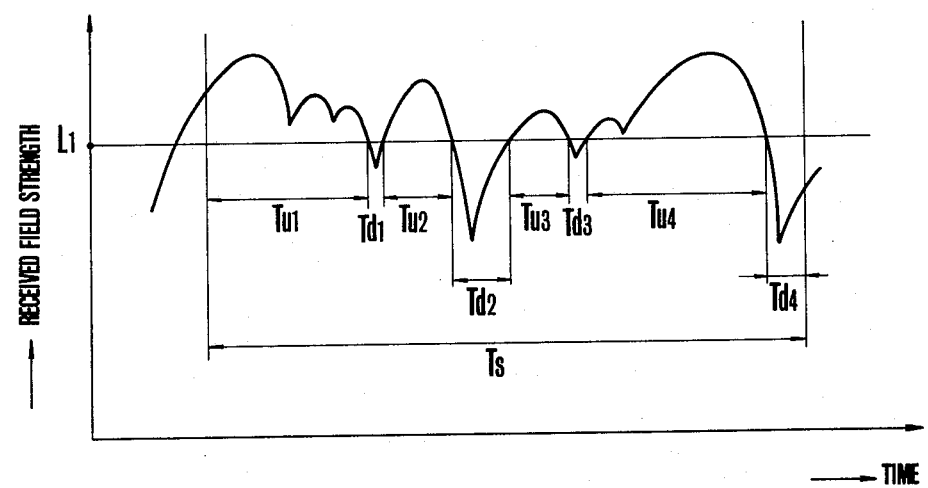

More specifically, reference is made to FIGS. 3A and 3B which illustrate two examples of the variation in the RF signal level caused by fading, where ordinate represents the received field strength and abscissa time. Level L1 signifies a predetermined level and time Ts signifies the measurement time span or a maximum measurement time (to be explained later). Tu1 through Tu4 are time segments in which the RF signal level is higher than the reference level L1, and Td1 through Td4 are time segments in which the signal level is lower than the reference level.

Figure 4:
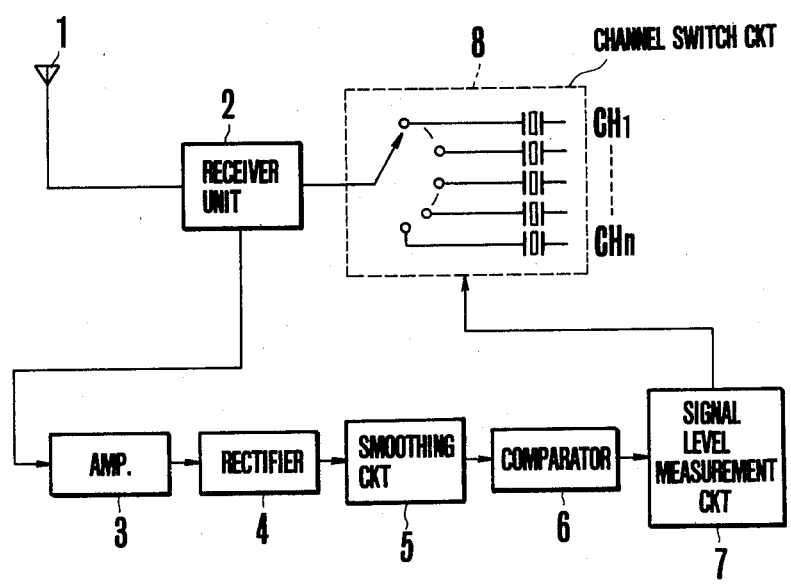
FIG. 4 is a schematic circuit block diagram of a prior art channel selecting system.

In a conventional channel selecting system as shown in FIG. 4, the best channel is selected which makes maximum a total of time segments Tu1, Tu2, Tu3 and Tu4 in which the signal level is higher than the reference level L1 within the predetermined measurement time span Ts.

As far as comparison between the above two examples is concerned, the channel corresponding to FIG. 3B is of course selected as the best channel.

Thus, a prior art channel selecting system has a circuit arrangement as shown in FIG. 4. In the figure, a radio signal received by an antenna 1 is detected in a receiver unit 2 and amplified by an amplifier 3. The amplified signal is rectified by a rectifier 4 and converted into a DC voltage through a smoothing circuit 5. The DC voltage is converted into logical level "1" or "0" by comparator 6 with its reference level being adjusted so that it outputs "1" when the input RF signal level is higher than L1, or "0" when the signal level is lower than L1. A signal level measurement circuit 7 totals time segments in which the comparator 6 outputs "1" within the predetermined time span Ts by counting pulses having a far shorter period than Ts, and when time span Ts has elapsed, the circuit 7 issues a channel switching or transfer signal to a channel switch circuit 8, so that measurement proceeds to the next channel. The above operation is repeated for all available channels, and a channel which provides a maximum of the total of time segments for logical "1" is determined as the channel in the highest signal level. Therefore, it takes time of at least $n \times Ts$ for measuring all channels CH1 through CHn, as mentioned previously.

A channel selecting system according to the present invention, however, does not measure the entirety of time segments in which the signal level is lower than L1 if the received signal level is extremely weak. Moreover, the full measurement time span corresponding to the predetermined measurement time Ts in the conventional system is not always required for measuring the relative signal level of one channel.

Figure 5:
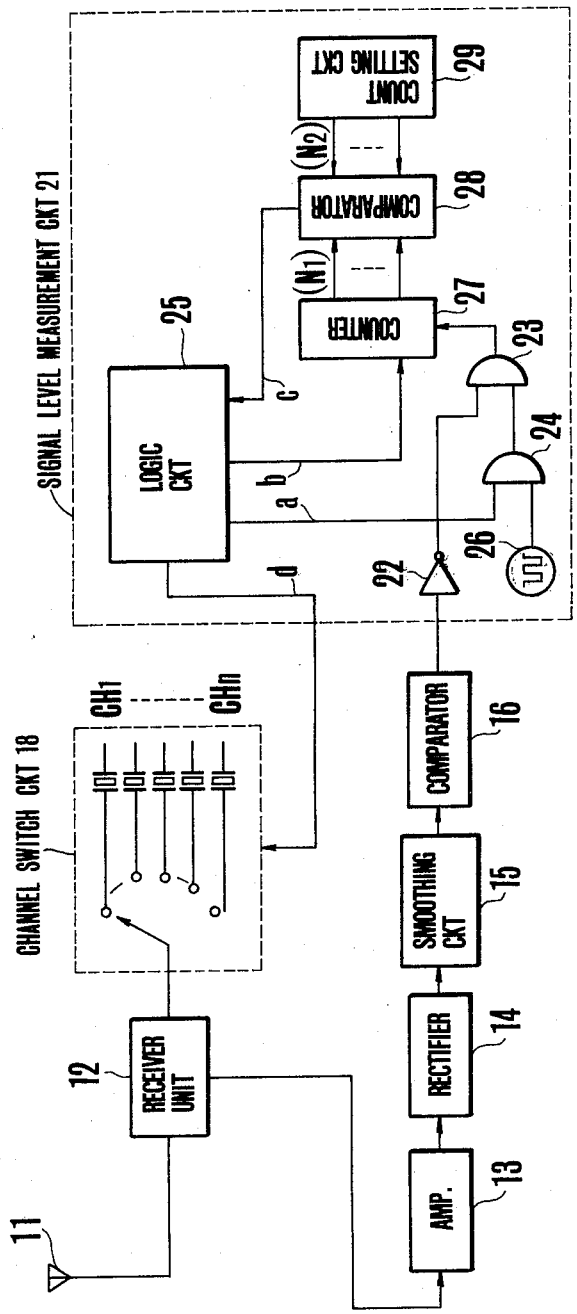
FIG. 5 is a schematic circuit diagram of a receiver unit in a channel selecting system embodying the present invention.

FIG. 5 shows a schematic construction of a channel selecting system, especially its receiver embodying the present invention, in which reference numbers used in FIG. 4 but added by 10 are used for circuit components having identical functions.

When a radio signal having a signal level higher (lower) than the reference level L1 is received by an antenna 11, a comparator 16 outputs logical "1" ("0") in the same fashion as in the case of FIG. 4. The binary signal is inverted by a NOT circuit 22, and the inverted signal is conducted to the input of an AND gate 23 in a signal level measurement circuit 21. Accordingly, the AND gate 23 becomes "conductive" when the RF signal level is lower than the reference level L1, i.e., within time segments Td1 through Td4 in FIG. 3A or 3B. On the other hand, an AND gate 24 is made conductive by logical "1" over control line a from a logic circuit 25 at the time when measurement for one channel is started. The signal on the control line a falls to "0" at the termination of measurement for one channel. Therefore, the output of a pulse generator 26 which generates a pulse train having a period e.g. in a frequency of 10 kHz, short enough relative to the maximum measurement time span is conducted through the AND gates 24 and 23 to a counter 27 which has been cleared at the beginning of the measurement by a signal over control line b from the logic circuit 25. The counter 27 counts the 10 kHz pulses for totaling time segments Td1, Td2, Td3 and Td4 (actually, Td4 need not be measured as will be described later), and sends a count N1 signifying a total of the time segments to a comparator 28.

A count setting circuit 29 issues a preset value N2 signifying substantially half the maximum measurement time span Ts to the comparator 28. When the comparator 28 detects that a count N1 from the counter 27 is equal to or larger than the present value N2 from the count setting circuit 29, it issues a signal over control line c to the logic circuit 25. Although the use of the preset value N2 which is half the maximum measurement time span Ts is practical, it is not limited to this condition.

In general, in measuring the received field strength of a radio wave, the field strength is expressed in terms of a medium value. With reference to FIGS. 3A and 3B, let the time segments Tu1 through Tu4 and Td1 throught Td4 be generalized as Tu1 through Tun and Td1 through Tdm. If the value of $$\sum_{n=1} Tun$$

is found equal to the value of $$\sum_{m=1} Tdm$$

within the predetermined measurement time span Ts, the median value of the received field strength is said to be L1, and if the former is larger than the latter $$\left( \sum_{n=1} Tun > \sum_{m=1} Tdm \right),$$

the median value of the recevied field strength is said to be higher than level L1. The longer the measurement time span Ts or the higher the frequency of fading within the time span Ts, the higher the accuracy of the median value becomes. That is to say, Ts can be short when the vehicle speed is high, whereas a long Ts is required for a low speed. In the following description, however, the value of Ts is set constant regardless of the above-mentioned relationship for determining the median value.

The signal level can be judged as higher than the median value L1 if the total of time segments in which values of received field strength are higher than L1 is at least 50% of the measurement time span Ts, and conversely, the signal level is deemed unsatisfactory if the total of time segments is less than 50%. Accordingly, if the signal level is judged less than L1 immediately when the $$\sum_{m=1} Tdm$$

of time segments in which values of received field strength are less than L1 becomes equal to or larger than Ts/2 and the channel is switched to the next one, it is possible to determine the best common control channel in a short time.

Assumption is made for example:

(1) Measurement time span Ts: 0.5 seconds (2) Number of common control channels to be checked: 16 channels (3) The mobile equipment receives signals higher than the median value only from three base stations out of 16 base stations.

In this example, conventional systems take 0.5 seconds for checking each channel, and a total of 8 (=0.5×16) seconds is required. According to the present invention, the full measurement over the measurement time span (0.5 seconds) is required for three base stations as in the case of the conventional systems, whereas only 0.5/2×(16−3)=3.25 seconds is required for remaining base stations, and the total channel scanning time becomes 4.75 (=0.5×3+3.25) seconds. Thus, time for checking the signal level of common control channels can almost be halved. The larger the number of channels to be scanned or the longer the measurement time span Ts, the more this system becomes effective.

Values of $$\sum_{m=1} Tdm$$

for individual common control channels are compared with each other, and a channel with the smallest value is locked.

Turning to FIG. 5, upon reception of a signal from the comparator 28, the logic circuit 25 terminates the measurement of the RF signal level even before the expiration of the maximum measurement time span Ts, and issues a signal over line d to a channel switch circuit 18 so as to switch the channel. Accordingly, the subsequent measurement for the next channel can be started before completing the measurement in the entire maximum measurement time Ts. If a count N1 does not reach the preset value N2, the channel is switched at the termination of the maximum measurement time span Ts.

As can be seen from the foregoing description, the circuit arrangement of FIG. 5 does not always take the maximum measurement time span Ts for measuring the relative RF signal level of each channel and thus the total measurement time for all channels can be made short as compared with the conventional system, whereby efficiency of the whole communication system is improved.

Assuming that the preset value N2 is 50% of Ts, the total of time segments in which N1 becomes equal to or larger than N2 is not Ts but is equal to To. This To extends from Tu1 to part of Td3, in the FIG. 3A example. In the FIG. 3B example, N1 does not reach N2 before Ts terminates, thus full time of Ts is required for satisfying N1−N2. Actually, both the cases as shown in FIGS. 3A and 3B will occur. However, according to the present invention, part of Td3 and all of Td4 can be saved in measuring the relative RF signal level of the FIG. 3A example for obtaining the same result of channel selection as in the case of the conventional system. Assuming that the actual measurement time To is distributed uniformly between 50% and 100% of the maximum measurement time span Ts, the average time saving in measuring all channels is 25%.

Figure 6:
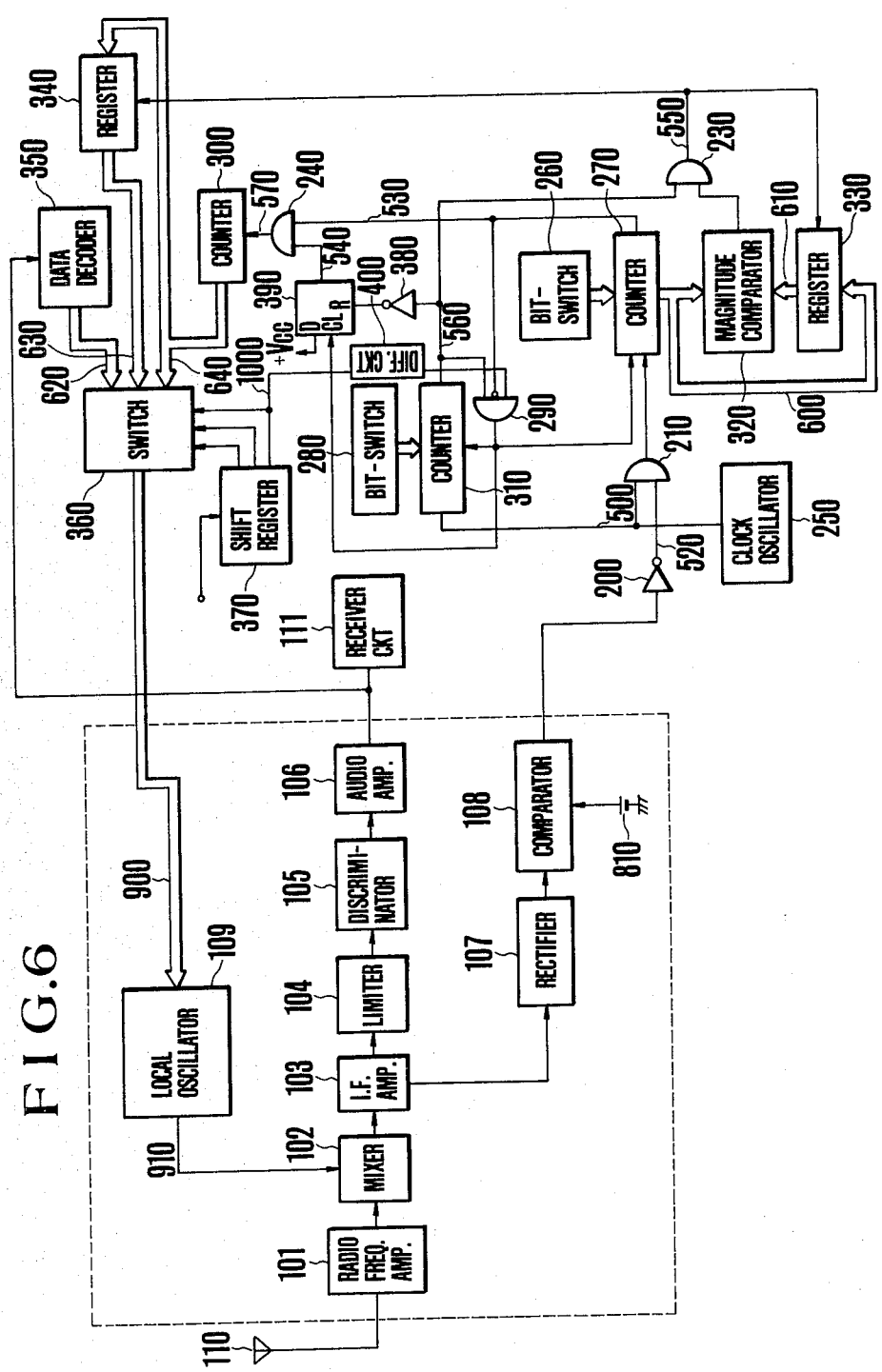
FIG. 6 is a block diagram of a circuit arrangement based on the FIG. 5 schematic circuit.

The FIG. 5 schematic circuit is specified in the form of a circuit arrangement as shown in FIG. 6. In the figure, a radio signal received by an antenna 110 is amplified by an amplifier 101, then mixed with the output of a local oscillator 109 by a mixer 102 so that it is converted into an IF signal. The IF signal is then amplified by an IF amplifier 103, conducted through a limiter 104 to eliminate the AM distortion, then demodulated by a discriminator 105. The demodulated signal is further amplified by an audio amplifier 106, and then supplied to a receiver circuit 111 such as a handset receiver or speaker. The output of the IF amplifier 103, on the other hand, is rectified by a rectifier 107 and its DC output voltage is converted into either logical "1" or "0" by a comparator 108. The comparator has a threshold level L1 which has been preset by adjusting a reference voltage source 810, so that it outputs "1" when the input RF signal level is higher than L1, or "0" when the signal level is lower than L1. The binary output is inverted by a NOT circuit 200, and then conducted to the input of an AND gate 210 via line 520. Accordingly, the AND gate 210 becomes "conductive" when the received field strength is lower than the reference value L1, i.e., for time segments Td1 through Td4 shown in FIGS. 3A and 3B.

A clock oscillator 250 generates a pulse train whose period is short enough as compared with the maximum measurement time span Ts, e.g., it generates 256 pulses within Ts, and it supplies output pulses to the clock input of a counter 310 via line 500. Now, when a shift register 370, which selectively designates the channel scanning mode, lock mode and speech channel mode, makes transition on its output line 1000 from "1" to "0", a setup value of a bit-switch 280 is loaded into the pre-settable counter 310 (available for example as CD40103) through differentiator 400 and AND gate 290, and it starts counting for pulses from the clock oscillator 250 and the output of type D flip-flop 390 which is high is fed to an AND gate 240.

Figure 8:
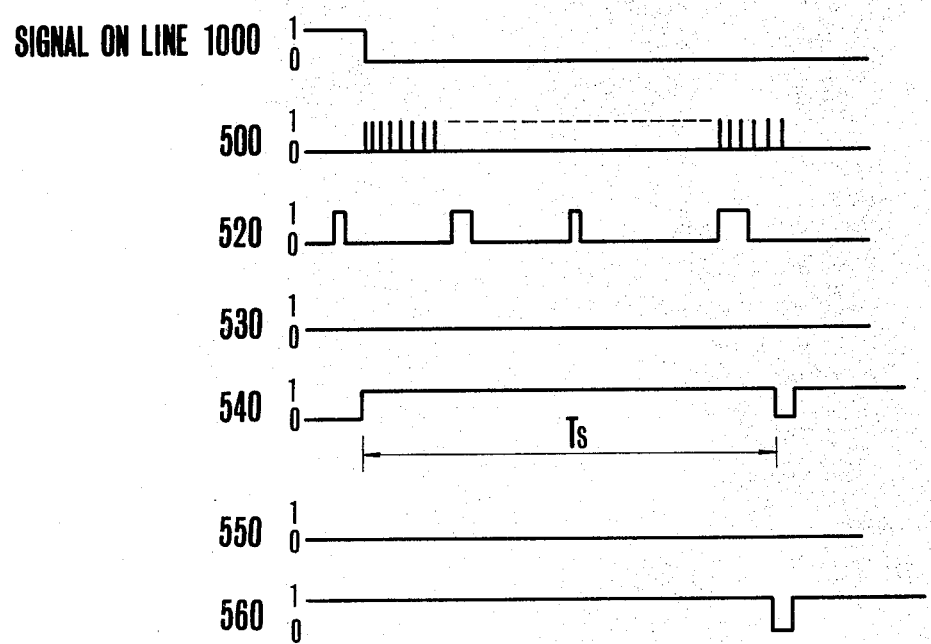
FIG. 8 is a time chart useful in explaining the channel switching effected at the termination of the maximum measurement time span.

Assuming that the preset counter 310 has been set by the bit-switch 280 with a count of 256, for example, the maximum measurement time span Ts is given by 256×(period of clock oscillator 250), and a negative pulse is supplied to a NOT circuit 380 after a period of Ts has elapsed (see signal on line 560 in FIG. 8).

On the other hand, a preset counter 270 (available for example as CD40163), which has been preset by a bit-switch 260 to a count of 128 corresponding to a half Ts period, is supplied with pulses from the clock oscillator 250 when the input RF signal level goes down below L1 and the AND gate 210 becomes conductive as mentioned previously.

Figure 7:
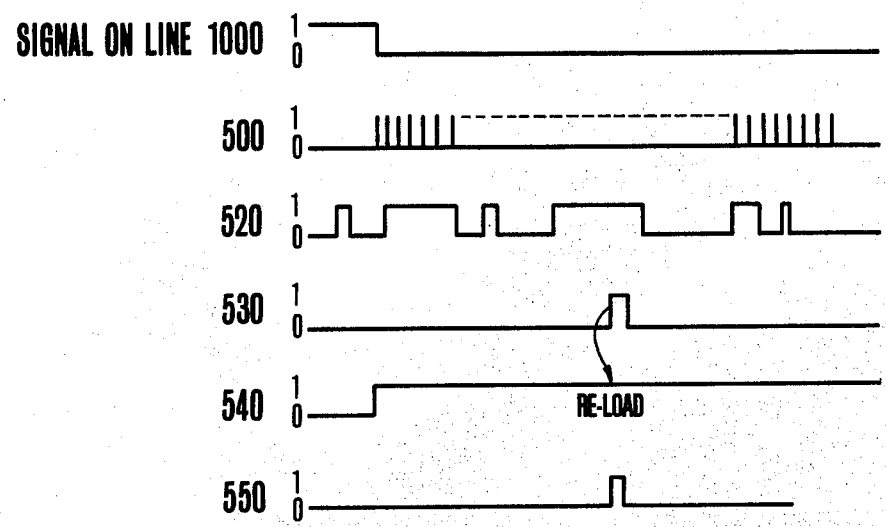
FIG. 7 is a time chart useful in explaining the channel switching effected within a maximum measurement time span.

As shown in FIG. 7, if a positive pulse is supplied from the preset counter 270 via line 530 to the AND gate 240 having "1" input on line 540 before expiration of the maximum measurement time span Ts which is determined by counter 310, the pulse is conducted through the AND gate 240 and line 570 to the clock input of a binary counter 300. At this time, a switch circuit 360 has been so controlled that output data from the counter 300 is conducted to line 900.

The output data on line 900 causes a local oscillator 109, as will be described later, to switch the common control channel. Consequently, switching of the common control channel is carried out without resort to the measurement over the full maximum measurement time span Ts.

Conversely, if the preset counter 270 does not output a positive pulse within the maximum measurement time span Ts, the pulse is not supplied through the AND gate 240 to the counter 300, and switching of the common control channel does not take place until the period Ts has elapsed, as shown in FIG. 8.

In this way, values of $$\sum_{m=1} Tdm,$$

i.e. the contents of the counter 270, for individual common control channels are compared with each other by scanning, and a channel with the smallest count is locked.

This comparison operation is carried out as follows. At the beginning of the channel scanning mode, the largest value which is in the counter 270 is set to a magnitude register 330. After Ts has elapsed when counter 310 has counted over, the count of the counter 270 on line 600 is compared with the contents of the register 330 on line 610 at a magnitude comparator 320 and if the count of the counter 270 is smaller than the contents of the register, this register 330 is rewritten with the counter count and the contents of the channel counter 300 on line 640 is stored in a channel register 340 by a signal on line 550 from AND gate 230. The comparison operation proceeds to the next control channel to be checked, and if the count of the counter 270 is smaller than the contents of the register 330, the contents of the registers 330 and 340 are updated again. On completion of the channel scanning mode, the shift register 370 proceeds to the lock mode, and the final contents of the register 340, i.e. the channel number corresponding to the smallest count of the counter 270, is output over line 630 and then over line 900 through the switch circuit 360.

Through the above-mentioned process, the mobile equipment locks the tuning frequency to the common control channel with the highest field strength so as to wait for a call.

In the common control channel system, the speech channel number is indicated by a data signal on a down path control channel, and when this signal is conducted via the audio amplifier 106 to a data decoder 350, the shift register 370 proceeds to the speech channel mode, and the output of the data decoder 350, i.e. the channel number of a speech channel, is output over line 620 and then over line 900 through the switch circuit 360.

FIG. 9 illustrates in detail the local oscillator 109 shown in FIG. 6. An 8-bit binary signal (90-1, 90-2, ... , 90-8) from the switch circuit 360 is conducted to a binary-to-decimal decoder 94, and a decoded signal is supplied to one of crystal oscillators 93-1 to 93-n via one of diodes 93-1 to 93-n, so that one of crystal oscillators is selected. The crystal oscillators correspond to channel 1 through channel 256, and the signal from a selected crystal oscillator is supplied via line 910 to the mixer 102 in FIG. 6.

What is claimed is:

1. A channel selecting system for use in a multi-channel mobile communication system comprising receiver means for receiving radio wave signals on a plurality of channels, and field strength measuring means for sequentially measuring the received field strength associated with each channel, said field strength measuring means comprising:

means for totaling time segments in which the field strength is lower than a predetermined level determined by the selecting system, within a measurement time span for each channel, said totaling means including pulse train generator means for generating pulses which are counted by the totaling means during said time segments in which the field strength is lower than said predetermined level;

means for setting a reference time length which is less than the measurement time span;

comparing means for comparing the length of time of the totaled time segments with said reference time length and generating a signal when said totaled time length is greater than or equal to said reference time length;

switching means coupled to said comparing means for switching said communication system from one of said plurality of channels to another one of said plurality of channels upon the occurrence of at least one of said signal generated by said comparing means, and the elapsing of said measurement time span;

whereby the selecting system selects the channel with the highest relative field strength as measured by the selecting system.

2. A channel selecting system according to claim 1 wherein said measurement time span is a maximum measurement time for each channel.

3. A channel selecting system according to claim 1 wherein said reference time length is normally 50% or more of said measurement time span.

4. A channel selecting system according to claim 1 which further comprises:

means for converting the received field strength into a binary logic with respect to said predetermined level;

a logic circuit which produces a control signal indicative of the start and termination of the field strength measurement for each channel; and wherein said totaling means comprises:

first gate means responsive to said control signal to pass therethrough a pulse train of a far smaller period than the measurement time span;

second gate means responsive to the output of said first gate means to pass therethrough the output of said converting means; and a counter which counts the output of said second gate means, whereby the time segments in which the field strength is lower than said predetermined level are counted.

5. A channel selecting system according to claim 1 further comprising means for comparing the totals of the time segments associated with the respective channels, for determining a minimal total.

* * * * *

UNITED STATES PATENT AND TRADEMARK OFFICE
CERTIFICATE OF CORRECTION

PATENT NO. : 4,365,347
DATED : Dec 21, 1982
INVENTOR(S) : Otsuka, et al.

It is certified that error appears in the above-identified patent and that said Letters Patent are hereby corrected as shown below:

| COLUMN | LINE | DESCRIPTION |
| --- | --- | --- |
| 4 | 40 | Delete "line a" and insert --line $\underline{a}$--. |
| 4 | 42 | Delete "line a" and insert --line $\underline{a}$--. |
| 4 | 50 | Delete "line b" and insert --line $\underline{b}$--. |
| 4 | 62 | Delete "line c" and insert --line $\underline{c}$--. |
| 6 | 13 | Delete "line d" and insert --line $\underline{d}$--. |

Signed and Sealed this

Twenty-sixth Day of November 1985

[SEAL]

Attest:

DONALD J. QUIGG

Attesting Officer

Commissioner of Patents and Trademarks